FABRICATING SEMICONDUCTOR DEVICES

Filed Nov. 8, 1968

INVENTORS
HENRY KRESSEL AND
FRANK Z. HAWRYLO

BY Abraham Sherman
ATTORNEY 3,560,275

FABRICATING SEMICONDUCTOR DEVICES

Henry Kressel, Elizabeth, and Frank Z. Hawrylo, Trenton, N.J., assignors to RCA Corporation, a corporation of Delaware Filed Nov. 8, 1968, Ser. No. 774,421
Int. Cl. H01l 7/38
U.S. Cl. 148—171 8 Claims

ABSTRACT OF THE DISCLOSURE

A PN junction is formed in a solution grown epitaxial layer consisting of a mixed III–V compound semiconductive material by utilizing a single amphoteric conductivity modifier in the solution, and varying the temperature of the solution during the deposition of the epitaxial layer. The semiconductive material has the composition $B_aAl_bGa_cIn_dN_eP_fAs_gSb_h$, wherein each of subscripts, $a$, $b$, $c$, $d$, $e$, $f$, $g$, $h$ ranges from 0 to 1, and $a+b+c+d=1$, and $e+f+g+h=1$. The amphoteric conductivity modifier is silicon or germanium, and the addition of the amphoteric modifier to the solution shortly before the deposition of the epitaxial layer is especially efficacious. Also described is the fabrication of an improved electroluminescent diode from a sub-class of the mixed III–V compound materials comprising two members of the group consisting of boron, aluminum, gallium and indium, and one member of the group consisting of nitrogen, phosphorus, arsenic and antimony.

BACKGROUND OF THE INVENTION

This invention relates to improved methods of fabricating semiconductor junction devices such as electroluminescent diodes, and more particularly to improved methods of forming PN junctions in epitaxial layers of mixed III–V compound semiconductive materials.

Epitaxial layers of crystalline semiconductive material have been deposited on a crystalline substrate by flooding a surface of the substrate with a solution of a semiconductive material in a molten metal solvent, then cooling the solution so that a portion of the dissolved semiconductive material precipitates and deposits on the substrate as an epitaxial layer; then decanting the remainder of the solution. The method is known as solution growth or liquid phase epitaxy. For a detailed description, see H. Nelson, Epitaxial Growth from the Liquid State and Its Application to the Fabrication of Tunnel and Laser Diodes, RCA Review 24, p. 603, 1963. The solution may include a single given conductivity type modifier, so that the deposited epitaxial layer is of given conductivity type. Alternatively, the solution may contain two different conductivity type modifiers of mutually opposite types. The concentrations and solubilities of these two modifiers are such that the first-deposited portion of the epitaxial layer is of one conductivity type, while the subsequently deposited portion is of the opposite conductivity type. For details, see U.S. Pat. 3,158,512, issued Nov. 24, 1964 to H. Nelson et al., and assigned to this assignee.

The solution growth method has been utilized to deposit on a substrate certain III–V compound semiconductors, for example gallium arsenide, as epitaxial layers containing a PN junction, although the solution contains only a single conductivity modifier. This is possible because certain conductivity modifiers, such as silicon and germanium, are amphoteric in gallium arsenide. These modifiers are incorporated in different portions of the crystal lattice of the epitaxial gallium arsenide layer, depending on the temperature, and hence may act as donors if incorporated in the epitaxial lattice at one temperature, and act as acceptors if incorporated in the lattice at a lower temperature. For details, see for example H. Kressel et al., "Luminescence in Silicon-Doped GaAs Grown by Liquid-Phase Epitaxy," Journal Applied Physics, vol. 39, No. 4, pp. 2006–2011, March 1968. Although amphoteric conductivity modifiers have been successfully utilized for this purpose with certain III–V compound semiconductors, they have not been satisfactory with other III–V semiconductors such as gallium phosphide.

The III–V compound semiconductors, meaning the nitrides, phosphides, arsenides and antimonides of boron, aluminum, gallium and indium, are generally miscible with each other to form the mixed III–V compound semiconductors, meaning materials having the formula $B_aAl_bGa_cIn_dN_eP_fAs_gSb_h$ wherein the subscripts $a$, $b$, $c$, $d$, $e$, $f$, $g$, $h$ may vary from 0 to 1, and $a+b+c+d=1$, and $e+f+g+h=1$. These mixed compound semiconductors can be utilized in the fabrication of junction devices. However, the introduction of satisfactory PN junctions in these materials is difficult. A sub-class of these compound semiconductors composed of two members selected from the group consisting of boron, aluminum, gallium and indium, and one member selected from the group consisting of nitrogen, phosphorous, arsenic and antimony, has been utilized to fabricate electroluminescent diodes by diffusing zinc into the material to form the P type region of the diode. While satisfactory electroluminescent diodes have thus been fabricated, improvement in the efficiency of such diodes is desirable.

SUMMARY OF THE INVENTION

A semiconductor device including a rectifying barrier within an epitaxial layer of a crystalline mixed III–V compound semiconductive material is fabricated by the solution growth process, utilizing a single amphoteric conductivity modifier in the solution. An improved electroluminescent diode is fabricated in this manner by utilizing as the epitaxially deposited semiconductive material a ternary compound comprising two members of the group consisting of boron, aluminum, gallium and indium, and one member of the group consisting of nitrogen, phosphorus, arsenic and antimony, with silicon or germanium as the amphoteric conductivity modifier. Preferably, the amphoteric conductivity modifier is dissolved in the solution shortly before the deposition of the epitaxial layer.

THE PREFERRED EMBODIMENTS

Example I

Figure 1:
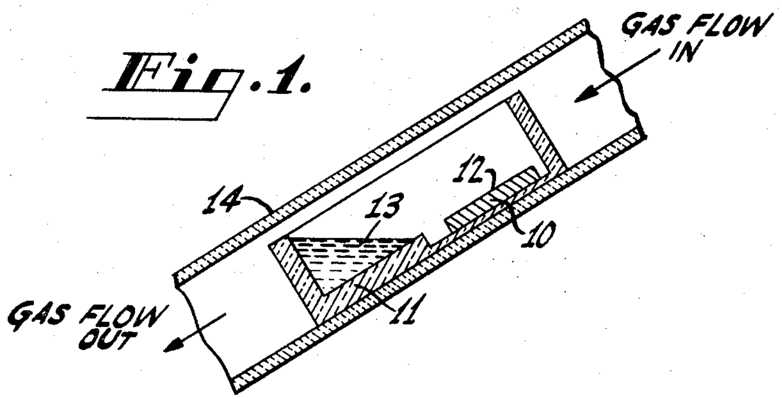
FIG. 1 is a cross-sectional schematic view of apparatus useful in the practice of the invention.
Figure 2:
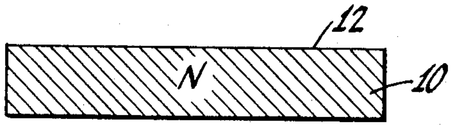
FIGS. 2–5 are cross-sectional views of a crystalline semiconductive body during successive steps in the fabrication of a PN junction device according to the invention; and, FIG. 6 is a cross-sectional view of a completed electroluminescent diode fabricated in accordance with the invention.

Referring to FIG. 1 of the drawing, a charge 13 is introduced into one end of boat 11. In this example, the charge consists of about 5 grams of gallium arsenide, about 25 to 200 milligrams aluminum, about 10 milligrams silicon as the amphoteric conductivity modifier, and about 25 grams gallium as the solvent. The materials of the charge are suitably in granulated or powder form. The boat 11 is then placed in a refractory furnace tube 14, which may suitably consist of fused quartz. The furnace tube 14 is swept with an inert gas such as nitrogen or argon, or with a reducing gas such as hydrogen, in order to maintain a non-oxidizing ambient during the fabrication.

The charge 13 is preheated to a temperature above the melting point of the solvent metal included in the charge. In this example, the preheating temperature is 980° C., which is more than sufficient for the solvent metal to melt and dissolve the semiconductive material, and the conductivity modifier. However, for best results it has been found that the amphoteric conductivity modifier, or at least the bulk of it, should not be added to the charge until after the charge has become homogenized. In this example, after the charge has been heated to a temperature of about 980° C. and is completely molten and homogenized, the charge is cooled to room temperature. The tube 14 is tilted so that the solution or molten charge 13 remains at one end of boat 11. Boat 11 is removed and kept in this tilted position while a semiconductive wafer 10 is positioned at the opposite end of boat 11. The wafer 10 may be of any given size and shape and conductivity. In this example, the wafer 10 consists of N type gallium arsenide, is about ¾″ in diameter, has a thickness of about 15 to 20 mils, and a resistivity of about 0.001 ohm-cm. The furnace boat 11 has means such as double bottom to secure the wafer 10 in the boat 11 with one wafer face 12 exposed, and may for example be made of graphite or the like. At this time, the amphoteric conductivity modifier, which in this example consists of about 15 milligrams of silicon, is added to the charge 13.

The furnace boat 11 is now replaced in the furnace tube 14, which is tilted so that the charge 13 is at the lower end of the boat 11. The furnace tube 14 is again swept with an inert or reducing gas, while the tube 14 and its contents are heated to about 900° C. The furnace tube 14 is then brought to a horizontal position so that the exposed surface 12 of the wafer 10 is flooded with the molten charge. The charge is cooled, preferably at the rate of about 0.5° to 10° C. per minute, and a portion of the mixed composition semiconductive material which was dissolved in the charge begins to precipitate from the charge and deposits epitaxially on the flooded wafer surface 12. A first portion 15 (FIG. 3) of an epitaxial semiconductive layer is thus grown on wafer face 12, in which portion the silicon is incorporated in the crystal lattice in such a manner that the layer 15 is N type. In this example the mixed composition semiconductive material thus deposited consists of $Al_xGa_{1-x}As$, wherein $x$ is less than 1.

As the molten charge continues to cool, a second portion or layer 16 of the mixed composition semiconductive material is deposited epitaxially on the first layer 15. However, the effect of the lower temperature to change the location of the silicon incorporated in the crystal lattice of layer 16, so that layer 16 is of P type conductivity. The boundary or interface 17 between the earlier-deposited layer 15 and the later-deposited layer 16 constitutes a rectifying barrier of the PN junction type. The PN junction 17 thus formed is substantially planar, and extends over the entire originally exposed surface 12 of the wafer 10. Although for convenience the first recrystallized portion or layer 15 and the second recrystallized portion or layer 16 are shown as distinct layers in the drawing, it will be understood that there is really only one epitaxial layer formed on surface 12 of wafer 10, and this epitaxial layer contains silicon atoms incorporated in its crystal lattice. These silicon atoms act as donors in the first formed portion 15 of the epitaxial layer but act as acceptors in the second formed portion 16 of the epitaxial layer, so that a PN junction 17 exists in the transition region between the two layers or portions.

Figure 3:
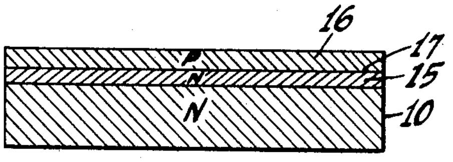

After the temperature of the molten charge 13 has dropped to about 400° C., the furnace tube 14 is again tipped, so that the remainder of the molten charge is decanted. The semiconductive body in this step is illustrated in FIG. 3. The total thickness of the two epitaxial layers 15 and 16 is about 2 to 4 mils. Improved results are obtained by making the first deposited N type layer 15 less than 1 mil thick, suitably about 0.5 to 0.7 mil thick.

Figure 4:
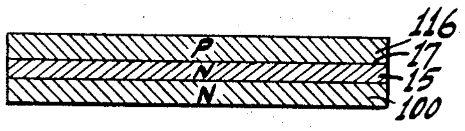

The uppermost epitaxial layer 16 is now lapped or etched or polished to remove about ½ to 1 mil of the thickness of this layer. Next, the surface of the body 10 which is opposite the epitaxial layers 15 and 16 is similarly lapped or etched so that the total thickness of the semiconductive body and the epitaxial layers is reduced to about 4 mils. The structure thus formed is illustrated in FIG. 4. In this example, the P type layer 116 at this stage is about 1 to 2 mils thick; the N type layer 15 is about 0.5 to 0.7 mil thick; and the remainder 100 of the original body 10 is about 1 to 2 mils thick.

Figure 5:
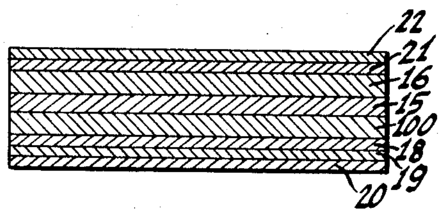

The assemblage is now heated in vacuum to about 550° C., and a tin layer 18 (FIG. 5) is deposited by evaporation to a thickness of a few microns on the surface of the remainder 100 of the original body 10. The assemblage is next treated in an electroless nickel plating bath. A nickel layer 19 is thus deposited on the tin layer 18. At the same time, a nickel layer 21 is deposited on the epitaxial layer 16. The electroless nickel layers 19 and 21 are suitably a few microns thick. The assemblage is then immersed in a gold plating bath to deposit gold layers 20 and 22 on the nickel layers 19 and 21 respectively. The assemblage is now diced or cleaved to form square dies about 5 to 10 mils on edge. The metal layers on the opposing major faces of each such die serve as ohmic contacts.

Figure 6:
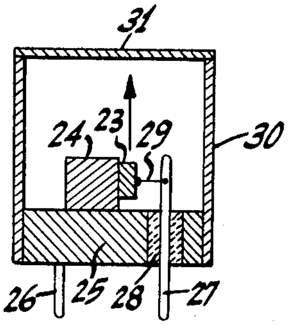

Referring now to FIG. 6, one such die 23 is bonded by means of the metal layer (not shown) on one die face to one side of a molybdenum pedestal 24 on a Kovar header 25. The header 25 includes one lead 26 extending from the bottom of the header, and another lead 27 electrically insulated from the header by means of a glass bead 28. A gold wire 29 is soldered to the lead 27 and to the exposed face of the die 23. A metallic can 30 having a transparent glass lens 31 is sealed around the header. When the diode is pulsed in the forward direction, light is emitted from the junction in the epitaxial layer of the die and travels in the direction shown by the arrow through the transparent lens or cap 31 of the device.

Example II

In the previous example, part of the silicon conductivity modifier was present in the charge before it was homogenized by heating it to a temperature above its melting point, and part of the silicon was added to the charge after it had been homogenized.

In the present example, the charge 13 in the furnace boat 11 (FIG. 1) consists of about 5 grams gallium arsenide, about 25 to 200 milligrams aluminum, and about 25 grams gallium as the solvent. The charge 13 is preheated in a furnace tube 14 as described in Example I above to a temperature of the melting point of the charge, then cooled to room temperature while the furnace tube 14 is tilted, so that the charge 13 remains at one end of boat 11. The boat 11 is removed, and kept in the tilted position while a semiconductor wafer 10 is positioned at the opposite end of boat 11. At this time about 25 milligrams of silicon is added to the charge 13. The remaining steps of heating the charge to about 900° C., moving the furnace tube 14 to a horizontal position so as to flood the exposed surface 12 of the semiconductor wafer 10, and depositing epitaxial layers on the semiconductor wafer, with a PN junction between the first deposited layer and the subsequently deposited layer, are similar to those described above in connection with Example I. The semiconductor wafer thus prepared may similarly be fabricated into electroluminescent diodes.

Example III

In the previous examples, the epitaxially deposited semiconductive layer consisted of $Al_xGa_{1-x}As$. In the present example, the epitaxially deposited semiconductive layer consists of $In_xGa_{1-x}P$, wherein $x$ is less than 1.

In the present example, the charge 13 in the furnace boat 11 (FIG. 1) consists of about 5 grams of indium, two grams of gallium phosphide, and 5 grams of gallium as the solvent. The charge 13 is preheated in a furnace tube 14 as described in Example I above to a temperature above the melting point of the charge, then cooled to room temperature while the furnace tube 14 tilted, so that the charge 13 remains at one end of boat 11. The boat 11 is then removed and kept in the tilted position while a semiconductive gallium arsenide wafer 10 is positioned at the opposite end of boat 11. At this time, about 30 milligrams of silicon is added to the charge 13. The charge is then reheated in the tilted position to about 1000° C., thereby melting the charge and distributing the silicon therein. The furnace tube 14 is then brought to a horizontal position so as to flood the exposed surface 12 of the semiconductor wafer 10. An epitaxial layer of silicon doped $In_xGa_{1-x}P$ is thereby deposited on the exposed surface 12 of the wafer 10. As the temperature decreases, the portion of the epitaxial layer subsequently deposited is of opposite conductivity type to the first deposited portion. A PN junction is thereby formed within the epitaxial layer. The wafer thus prepared may be utilized to fabricate electroluminescent diodes in the manner described in Example I.

Example IV

In the present example, the epitaxially deposited semiconductive layer consists of $In_xGa_{1-x}As$, wherein $x$ is less than 1.

The charge 13 (FIG. 1) in this example consists of about 3 grams of indium, two grams gallium arsenide, and 7 grams gallium as the solvent. The charge 13 is preheated in a furnace tube 14 as described in Example I above to a temperature above the melting point of the charge, suitably above 900° C., then cooled to room temperature while the furnace tube 14 is tilted so that the charge 13 remains at one end of the furnace boat 11. The boat 11 is removed and kept in the tilted position while a gallium arsenide semiconductive wafer 10 is positioned at the opposite end of boat 11 so as to expose one major face 12. At this time, about 30 milligrams of silicon is added to the charge 13. The remaining steps of heating the charge to about 900° C., bring the furnace tube 14 to a horizontal position so as to flood the exposed surface 12 of the semiconductive wafer 10, and depositing an epitaxial layer of $In_xGa_{1-x}As$ on the semiconductive wafer, are similar to those described above. As in the previous examples, the first deposited portion of the epitaxial layer is of N conductivity type, while the portion subsequently deposited at a lower temperature is of P conductivity type. A PN junction is thus formed in the epitaxial layer. The semiconductor wafer may then be diced to form diodes as previously described.

Example V

In the previous examples, the amphoteric conductivity modifier consisted of silicon. In the present example, the amphoteric conductivity modifier consists of an equivalent quantity of germanium, and the solvent metal consists of indium. When indium is used as the solvent metal, the charge is preferably heated to a temperature of about 600° C. The deposition of the epitaxial layer having a PN junction therein is in other respects performed as described in Example I. Epitaxial layers of $Al_xGa_{1-x}As$, wherein $x$ is less than 1, and the like may thus be deposited.

Various other modifications may be made by those skilled in the art without departing from the spirit and scope of the invention as set forth in the specification and the appended claims.

What is claimed is:

1. The method of fabricating a semiconductor device including a rectifying barrier within an epitaxial layer of a crystalline mixed compound semiconductive material, comprising the steps of:

(a) preheating a crystalline semiconductive body while exposing one surface thereof;

(b) preparing a charge comprising (i) a solvent selected from the group of materials and alloys which are electrically neutral with respect to said semiconductive body and said epitaxial layer, (ii) a mixed composition semiconductive compound having the formula $B_aAl_bGa_cIn_dN_eP_fAs_gSb_h$, wherein each of $a$, $b$, $c$, $d$, $e$, $f$, $g$ and $h$ range from 0 to 1, and $a+b+c+d=1$, and $e+f+g+h=1$, and (iii) an amphoteric conductivity modifier which is capable of acting as either an acceptor or a donor in said semiconductive compound material;

(c) separately preheating said charge to a temperature above the melting point of said charge but below the melting point of said body;

(d) flooding said exposed surface of said heated body with the molten charge;

(e) cooling said molten charge and said body so that a first portion of said semiconductive material in said charge precipitates from said charge and deposits on said one surface of said body as a first epitaxial layer having dissolved therein some of said amphoteric conductivity modifier and being of given conductivity type;

(f) continuing to cool said molten charge and said body so that a second portion of said semiconductive material in said charge precipitates from said charge and deposits on said first epitaxial layer as a second epitaxial layer, said second epitaxial layer having dissolved therein some of said amphoteric conductivity modifier and being of opposite conductivity type thereby forming a rectifying barrier between said first and second epitaxial layers;

(g) and decanting the remainder of said molten charge.

2. The method of fabricating a semiconductor device as in claim 1, wherein said amphoteric conductivity modifier is selected from the group consisting of silicon and germanium.

3. The method of fabricating a semiconductor device as in claim 1, wherein said molten charge and substrate is cooled at the rate of about ½ to 5° C. per minute.

4. The method of fabricating a semiconductor device as in claim 1, wherein said mixed composition semiconductive compound material has the composition $A_xB_{1-x}C$, wherein A and B are members of the group consisting of boron, aluminum, gallium and indium; C is a member of the group consisting of nitrogen, phosphorus, arsenic and antimony; and $x$ is less than 1.

5. The method of fabricating a semiconductor device as in claim 1, wherein said crystalline body is a semiconductor selected from the group consisting of the nitrides, phosphides, arsenides and antimonides of boron, aluminum, gallium and indium.

6. The method of fabricating a semiconductor device including a rectifying barrier within an epitaxial layer of a mixed compound crystalline semiconductive material, comprising the steps of:

(a) preheating a crystalline semiconductive body while exposing one surface thereof;

(b) preparing a charge comprising (i) a solvent selected from the group of materials and alloys which are electrically neutral with respect to said semiconductive body and said epitaxial layer, (ii) a mixed compound semiconductive material having the formula $B_aAl_bGa_cIn_dN_eP_fAs_gSb_h$, wherein each of $a$, $b$, $c$, $d$, $e$, $f$, $g$ and $h$ range from 0 to 1, and $a+b+c+d=1$ and $e+f+g+h=1$, (c) separately preheating said charge to a temperature above the melting point of said charge but below the melting point of said body;

(d) after said charge is molten, adding to said charge an amphoteric conductivity modifier which is capable of acting as either an acceptor or a donor in said semiconductive material;

(e) flooding said exposed surface of said heated body with the molten charge;

(f) cooling said molten charge and said body so that a first portion of said semiconductive material in said charge precipitates from said charge and deposits on said one surface of said body as a first epitaxial layer having dissolved therein some of said amphoteric conductivity modifier and being of given conductivity type;

(g) continuing to cool said molten charge and said body so that a second portion of said semiconductive material in said charge precipitates from said charge and deposits on said first epitaxial layer as a second epitaxial layer, said second epitaxial layer having dissolved therein some of said amphoteric conductivity modifier and being of opposite conductivity type thereby forming a rectifying barrier between said first and second epitaxial layers;

(h) and decanting the remainder of said molten charge.

7. The method of fabricating a semiconductor device including a rectifying barrier within an epitaxial layer of a mixed compound crystalline semiconductive material, comprising the steps:

(a) preheating a crystalline semiconductive body while exposing one surface thereof;

(b) preparing a charge comprising (i) a solvent selected from the group of materials and alloys which are electrically neutral with respect to said semiconductive body and said epitaxial layer, (ii) a mixed composition semiconductive compound material having the composition $A_xB_{1-x}C$, wherein A and B are members of the group consisting of boron, aluminum, gallium and indium; C is a member of the group consisting of nitrogen, phosphorus, arsenic and antimony; and $x$ is about 0.01 to 0.35;

(c) separately preheating said charge to a temperature above the melting point of said charge but below the melting point of said body;

(d) after said charge is molten, adding to said charge an amphoteric conductivity modifier which is capable of acting as either an acceptor or a donor in said semiconductive material;

(e) flooding said exposed surface of said heated body with the molten charge;

(f) cooling said molten charge and said body so that a first portion of said semiconductive material in said charge precipitates from said charge and deposits on said one surface of said body as a first epitaxial layer having dissolved therein some of said amphoteric conductivity modifier and being of given conductivity type;

(g) continuing to cool said molten charge and said body so that a second portion of said semiconductive material in said charge precipitates from said charge and deposits on said first epitaxial layer as a second epitaxial layer, said second epitaxial layer having dissolved therein some of said amphoteric conductivity modifier and being of opposite conductivity type thereby forming a rectifying barrier between said first and second epitaxial layers;

(h) and decanting the remainder of said molten charge.

8. The method of fabricating a semiconductor device as in claim 7, wherein said semiconductive body consists of gallium arsenide, said amphoteric conductivity modifier consists of silicon, and said semiconductive material consists of aluminum gallium arsenide.

References Cited

UNITED STATES PATENTS 3,158,512 11/1964 Nelson et al. ________ 148—1.5

OTHER REFERENCES

H. Rupprecht, "New Aspects of Solution Regrowth in the Device Technology of Gallium Arsenide." Paper No. 9, pp. 57–61, in "Proc. 1966 Symposium on GaAs in Reading"; ed. Inst. Phys. and Phys. Soc.

H. Kresel et al., "Luminescence in Silicon-Dope GaAs Grown by Liquid-Phase Epitaxy," J. Appl. Physics, vol. 39, pp. 2006–11, 1968.

L. DEWAYNE RUTLEDGE, Primary Examiner

E. L. WEISE, Assistant Examiner

U.S. Cl. X.R.

148—172